(12) United States Patent
Wagener et al.

(10) Patent No.: US 6,251,195 B1
(45) Date of Patent: Jun. 26, 2001

(54) METHOD FOR TRANSFERRING A MICROELECTRONIC DEVICE TO AND FROM A PROCESSING CHAMBER

(75) Inventors: Thomas J. Wagener, Shorewood; John C. Patrin, Chanhassen; William P. Inhofer, Plymouth; Kevin L. Siefering, Excelsior, all of MN (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 09/351,939

(22) Filed: Jul. 12, 1999

(51) Int. Cl.[7] ................................. B08B 1/00; B08B 5/00
(52) U.S. Cl. ................. 134/7; 134/2; 134/6; 134/9; 134/15; 134/25.5; 134/32; 134/42; 134/61; 134/66; 134/153; 451/65; 451/66
(58) Field of Search ............................ 134/153, 61, 66, 134/902, 2, 7, 9, 6, 15, 25.5, 32.42; 451/65, 66

(56) References Cited

U.S. PATENT DOCUMENTS

| | | | |
|---|---|---|---|
| 5,364,472 | * | 11/1994 | Heyn et al. ............................... 134/6 |
| 5,443,412 | * | 8/1995 | Yoshikawa et al. ..................... 451/5 |
| 5,485,644 | * | 1/1996 | Shinbara et al. ....................... 15/21.1 |
| 5,516,369 | * | 5/1996 | Lur et al. ............................... 134/1.3 |
| 5,599,398 | * | 2/1997 | Lenglen .................................... 134/1 |
| 5,784,799 | | 7/1998 | Kato et al. ............................... 34/92 |
| 5,810,942 | | 9/1998 | Narayanswami et al. ............... 134/7 |
| 5,820,692 | | 10/1998 | Baecker et al. ........................ 134/21 |
| 5,942,037 | * | 8/1999 | Wagener et al. ..................... 118/315 |
| 5,961,732 | * | 10/1999 | Patrin et al. ............................. 134/7 |

FOREIGN PATENT DOCUMENTS 10144757   11/1996 (JP) .

* cited by examiner

Primary Examiner—Sharidan Carrillo
(74) Attorney, Agent, or Firm—Kagan Binder, PLLC (57) ABSTRACT

An apparatus having a processing chamber for processing a semiconductor wafer under evacuated conditions that is capable of transfer of the wafer from the processing chamber under conditions that are substantially equal to the pressure of an adjacent environment. In a preferred embodiment, the processing chamber is pressurized and vented with a source of high purity dry gas that is diffused into the chamber through a diffuser to pressurize the processing chamber after processing of the wafer is completed. A chamber equalization port between the processing chamber and the adjacent environment is opened to maintain the pressure within the chamber at or slightly above the pressure of the adjacent environment, and the chamber valve is then opened. The wafer can then be removed from the processing chamber, and a new wafer can be inserted. The chamber is then sealed by closing the chamber valve and the equalization port, and the atmosphere within the processing chamber is evacuated to a desired level. The new wafer is then processed, and the above steps are repeated to remove the wafer once processing has finished.

22 Claims, 5 Drawing Sheets

METHOD FOR TRANSFERRING A MICROELECTRONIC DEVICE TO AND FROM A PROCESSING CHAMBER

FIELD OF THE INVENTION

The present invention is directed to an apparatus and method for transferring a workpiece from a processing chamber or into a processing chamber in which the workpiece is processed under evacuated conditions, the transfer of the workpiece into and/or out of the chamber being done substantially under the greater pressure (as measured relative to the processing conditions) of an environment that is adjacent to the processing chamber. More specifically, the present invention is directed to an apparatus useful in the processing of a silicon wafer under evacuated conditions (e.g. the cleaning of a surface of the wafer by an aerosol processing apparatus) in which the wafer can be inserted and removed from a processing chamber of the apparatus substantially under the greater atmospheric pressure of a handling environment that surrounds the processing chamber without jeopardizing the integrity of the processing chamber and/or the workpiece.

BACKGROUND OF THE INVENTION

In the making of microelectronic devices, such as semiconductor wafers, processing apparatus are frequently used to clean or otherwise process a surface of a substrate (e.g. a semiconductor wafer). Semiconductor wafers and other microelectronic devices are typically very sensitive to moisture and other contaminants. For example, semiconductor wafers typically include features such as a circuit that are comparable in size to a contaminant particle. It is thus important to prevent moisture and other contaminants from entering the processing apparatus or any other environment in which a microelectronic device is stored and/or processed.

To provide for specific processing characteristics, the processing of the wafer within a specific apparatus is often performed under evacuated conditions wherein the environment of the chamber in which the wafer is processed is held at a pressure that is less than the pressure of the environment surrounding the apparatus. For example, an aerosol cleaning apparatus can be used to clean a surface of a semiconductor wafer by impinging a stream of cryogenic fluid against the surface of the wafer. Cryogenic fluid comprises an aerosol spray including carrier gas and frozen particles, the frozen particles made by quickly freezing aerosol droplets that are created from a gas, such as argon. The flow of cryogenic fluid is propelled from a nozzle positioned over the wafer, and the frozen particles impinge upon the surface of the wafer to dislodge contaminants from the surface of the wafer. The pressure of the chamber in which the wafer is cleaned is controlled to provide a flow of cryogenic fluids that has the desired physical properties. For example, as is known, processing at a chamber pressure that is below the triple point of the cryogenic fluid that is dispensed from the cleaning nozzle will ensure the effective creation of frozen particles and thus prevent liquid cryogen droplets from falling on the workpiece, and upon evaporation leaving residues from particles originally embedded in the liquid droplet. In other words, the chamber pressure is controlled to optimize the processing steps performed within the chamber. In the case of an aerosol processing apparatus, the chamber pressure is typically controlled to be below the pressure of the environment that surrounds the apparatus. An aerosol processing apparatus for the controlled processing of a semiconductor wafer is described in U.S. Pat. No. 5,810, 942, entitled "Aerodynamic Aerosol Chamber" and assigned to the assignee of the present application, the entire disclosure of which is incorporated by reference herein for all purposes.

In such an apparatus where the processing of a microelectronic device occurs at a pressure that is below the pressure of the surrounding environment, it can be difficult to control (i.e. prevent) the introduction of moisture or other contaminants into the processing chamber during transfer of the microelectronic device into or out of the processing chamber. Simply opening the processing chamber while the chamber is at the reduced pressure used to process the wafers will cause air from the surrounding environment to enter the processing chamber. This air will likely contain moisture and other contaminants, which, if allowed into the processing chamber, may condense on the wafer and other surfaces within the processing chamber. In the case of cryogenic aerosol processing chambers, extremely cold surfaces used to deliver or that otherwise are affected by or come in contact with the cryogenic fluid are particularly susceptible to condensation of moisture and other contaminants.

The transferring of a wafer into and out of a cryogenic aerosol processing chamber thus is typically done within a sealed handling environment that surrounds an input/output port in the chamber. A plurality of wafers to be processed are typically positioned within a separate evacuated chamber that is contained within the handling environment, and a robotic arm that is positioned in another separate evacuated chamber in the handling environment is used to remove the wafer from the processing chamber through the port, grasp a new wafer from the plurality of wafers, and insert the new wafer through the port into the processing chamber. The pressure of the handling environment is held at a lower level than the pressure at which the wafers are processed. That is, the handling environment is typically on the order of 10 to 30 milli-Torr, while the pressure of the processing chamber during cleaning is typically about 50 Torr.

In order to remove or insert a wafer into the processing chamber of such a cryogenic cleaning apparatus, then, while minimizing the introduction of moisture or other contaminants onto the wafers to be processed, the processing chamber, the chamber containing the robot, and the chamber containing the plurality of wafers must be substantially equalized at each transition of the wafer from one of these chambers. That is, not only is it desirable to prevent fluid flow into the processing chamber, it is also desirable to prevent fluid flow out of the process chamber. To do this, the processing chamber is pumped down to a pressure that is substantially equal to the pressure of the handling environment to also prevent the transfer of gas from the processing chamber into the handling environment. This is because any pressure differential between the processing chamber and the handling environment will cause the transfer of some of the environment from within the higher pressure region to the lower pressure region when the processing chamber is breached. Any such fluid flow may cause a recirculation of contaminants onto either the wafer that was just processed or onto a wafer in the handling environment that is about to be processed. So, only after the processing chamber has been pumped down to the pressure level of the handling environment can the processing chamber be breached by opening the input/output port. Then, the processed wafer can be removed, and a new wafer can be inserted into the chamber with minimal exchange of environments between the processing chamber and the handling environment. The processing chamber can then be resealed and its pressure can be raised to the desired processing pressure.

As mentioned above, it is important to control the introduction of moisture and contaminants into any environment in which the semiconductor wafers are positioned. This is particularly true where the environment in which the wafers are positioned is evacuated during a process cycle, such as during the transfer of a wafer into or out of the processing chamber described above. This is because a reduction in pressure may cause moisture and any surrounding contaminants to condense upon the wafer or cryogenic elements of the apparatus. In an aerosol processing apparatus, where apparatus components can be extremely cold due to the extremely cold temperatures at which the stream of cryogenic fluid is dispensed within the processing chamber, these problems can be particularly acute.

The step of reducing the pressure of the processing chamber from its processing pressure down to the level of the handling environment prior to breaching the processing chamber is time intensive, however, often taking 20 seconds or more to accomplish, which represents a substantial portion of the entire period of time it takes to process a wafer. This affects the number of wafers that can be processed in a given time period (i.e. the through-put of wafers through the chamber), which in turn negatively impacts the efficiency of the overall wafer manufacturing process. Moreover, it is time consuming in such prior art equipment to properly control the pressure levels of the various chambers in the handling environment and the processing chamber during wafer transfer between these chambers. Additionally, prior art equipment are complex given the need to maintain the handling environment chambers at low pressure while maintaining the processing chamber at a separate pressure. This adds cost and complexity to construction and maintenance of the overall system.

SUMMARY OF THE INVENTION

The present invention overcomes the shortcomings of prior art processing apparatus in that an apparatus and method for workpiece processing are provided that permit the pressurization and venting of a processing chamber for increasing the chamber pressure to a pressure at least the same as the pressure level of an environment that is adjacent the processing chamber. This pressurization and venting of the processing chamber can be controlled in accordance with the present invention to permit the transfer of a workpiece into the chamber from the adjacent environment or out of the chamber into the adjacent environment while preventing unwanted introduction of contaminants into the processing chamber. That is, the workpiece can be transferred from the processing chamber into the adjacent environment (or vice versa) while the processing chamber is at or slightly above the greater pressure (measured relative to the pressure at which processing occurs) of the adjacent environment. This permits faster workpiece transfer (i.e. there is no need to spend the time reducing the pressure therein) and thus increased through-put of the apparatus. The apparatus is also less complex as compared to a conventional apparatus, and more efficient to build, use, and maintain.

In a first aspect, the present invention is a method for transferring a first workpiece between a processing chamber at a first pressure and an adjacent environment at a second pressure that is greater than the first pressure. The method includes the steps of raising the pressure in the processing chamber from the first pressure to a level that is at least equal to the second pressure of the adjacent environment and opening a chamber equalization port operatively interconnected between the processing chamber and the adjacent environment. The chamber equalization port permits fluid communication between the processing chamber and the adjacent environment. A chamber valve that is interconnected between the processing chamber and the adjacent environment is opened to provide access to the interior of the processing chamber from the adjacent environment, and also to permit a second fluid communication between the processing chamber and the adjacent environment. The first workpiece is transferred between the processing chamber and the adjacent environment through the chamber valve after the chamber equalization port and the chamber valve have been opened.

In a second aspect the present invention is a method for processing a first workpiece by a cryogenic cleaning apparatus having a processing chamber. The apparatus includes a chuck for supporting a workpiece within the chamber and a nozzle for dispensing a stream of cryogenic aerosol. The apparatus further includes a chamber valve that permits the workpiece to be transferred between the processing chamber and an adjacent environment. The method includes the steps of supporting a workpiece within the processing chamber and reducing the pressure within the processing chamber to a processing pressure. Cryogenic aerosol is directed against a surface of the first workpiece contained within the processing chamber while the chamber is at the processing pressure. The pressure of the processing chamber is raised from the processing pressure to a transfer pressure that is at least equal to a pressure of the adjacent environment. The chamber valve is opened while the processing chamber is at the transfer pressure to provide access to the interior of the processing chamber from the adjacent environment, and the first workpiece is transferred from the processing chamber to the adjacent environment through the chamber valve.

In a third aspect, the present invention is a cryogenic aerosol cleaning apparatus for cleaning at least a surface of a portion of a first workpiece. The apparatus includes a processing chamber having an interior chamber that is sealable from exterior environmental conditions and a chuck for supporting a workpiece within the processing chamber. The apparatus further includes a nozzle for dispensing a stream of cryogenic aerosol, with the nozzle being connectable with a cryogenic aerosol source. A chamber access valve is provided on the apparatus to permit the workpiece to be transferred between the processing chamber and an adjacent environment, and a vacuum pump is fluidly connected to the processing chamber for evacuating the interior chamber and reducing its pressure to the processing pressure.

The apparatus further includes a chamber ventilation port positioned within the interior chamber for dispensing a flow of gas into the chamber. The port is connectable with a gas source for this purpose. A chamber equalization port is operatively positioned between the internal chamber of the processing chamber and the adjacent environment. The chamber equalization port able to be opened and closed for selectively permitting fluid communication between the internal chamber and the adjacent environment so that when the chamber equalization port is open, the pressure of the interior chamber can be at least equal to the pressure of the adjacent environment.

DETAILED DESCRIPTION OF THE PREFERRED EMBODIMENTS

With reference to the Figures, wherein like numerals represent like components throughout the several Figures, an apparatus 10 is illustrated for the treatment of a surface of a workpiece, such as a semiconductor wafer 18. The present invention is useful for treating a variety of workpieces, including microelectronic devices, computer hard drive components, multiple chip modules, and the like. The present invention can also be used to treat masks used for microlithography processes, including x-ray masks, and any semiconductor substrates, including but not limited to gallium arsenide or semiconductor wafers.

For the purposes of providing a specific description of the present invention, apparatus 10 will be described as a cryogenic aerosol cleaning apparatus used for cleaning contaminants from the surface of a semiconductor wafer. As set out in the Background section of this application, the extremely cold temperature environment of such equipment makes them particularly susceptible to fluid flow problems and environmental conditions that may occur during workpiece transfer. However, other apparatus used to treat or otherwise process a surface of a workpiece under evacuated conditions can of course be adapted to the principles of the present invention described herein.

Figure 1:
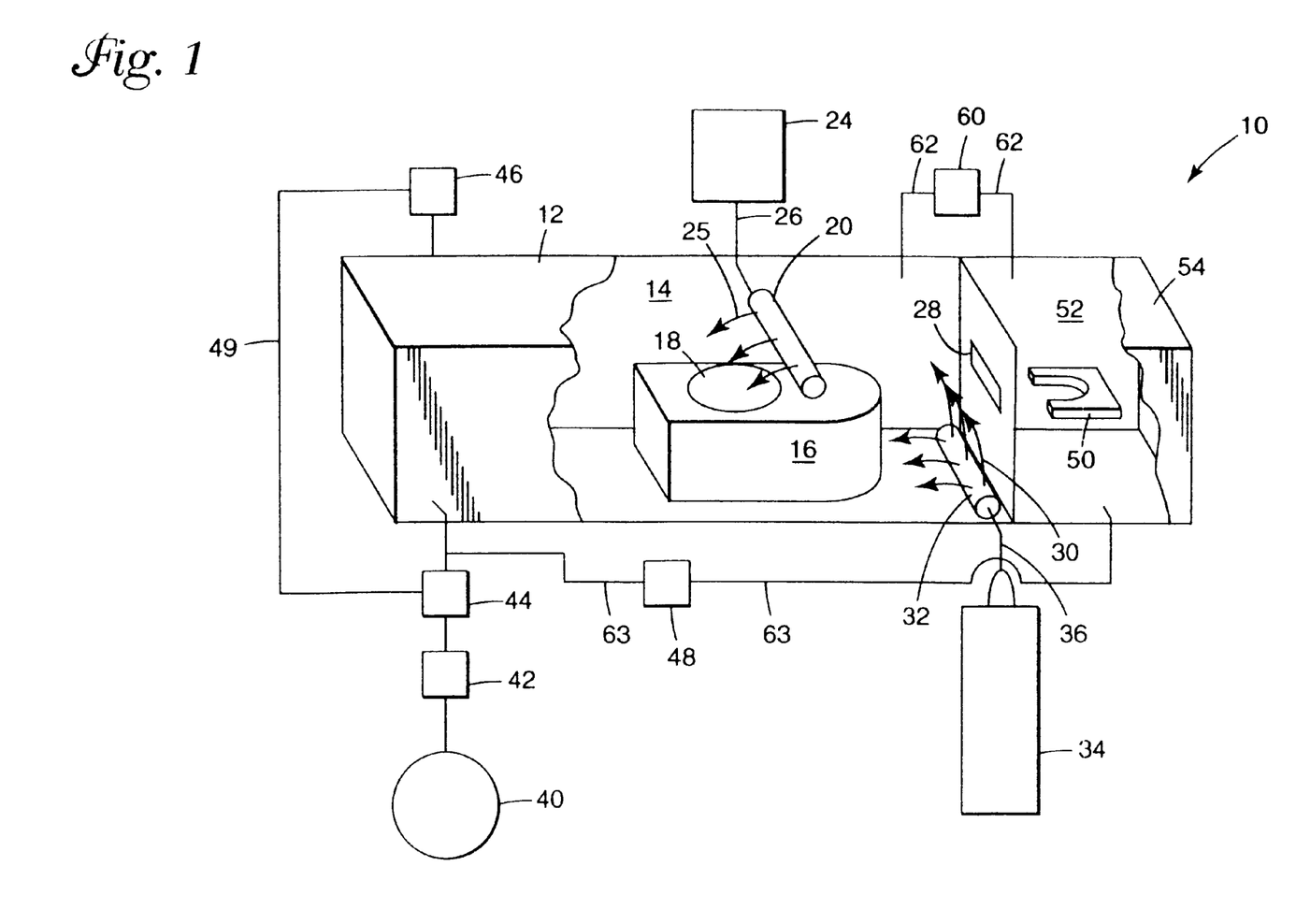
FIG. 1 is a schematic view of a processing apparatus in accordance with the present invention.

Apparatus 10 generally comprises a processing chamber 12 having a sealable interior space 14. A chuck 16 is positioned within interior 14, and is mounted for reciprocal longitudinal motion substantially along the length of chamber 12. Apparatus 10 further includes a jet impingement nozzle 20 mounted in processing chamber 12 above chuck 16. Nozzle 20 includes a plurality of orifices (not shown) along its length, and is fluidly connected to a source 24 of cryogenic fluid through a line 26. Source 24 is pressurized and is directed in a known manner to nozzle 20 through line 26. Nozzle 20 dispenses a stream 25 of cryogenic fluid from its orifices, and the pressure of chamber 12 during application of the stream 25 to wafer 18 is controlled to produce a desired stream of cryogenic fluid, as is known. That is, the dispensing of stream 25 can be controlled to provide a jet of frozen cryogenic particles by controlling the pressure of chamber 12 during the cleaning of wafer 18. A number of cryogenic fluids, such as nitrogen, argon, or ultra-pure dry air, can be used in this regard, with roughly a 3:1 blend of argon and nitrogen being a presently preferred cryogenic fluid. The manner of creating such a cryogenic aerosol spray itself is not a particular aspect of the present invention, and the design of such nozzles and other devices and controlling techniques are known as discussed in commonly assigned U.S. Pat. No. 5,810,942, which is fully incorporated herein by reference. Any known or developed nozzle, supply or controlling circuits and mechanisms can be utilized in accordance with the process chamber of the present invention.

As is also known, when initially placed into chamber 12 (described in more detail below), wafer 18 is engaged by an air-actuated lift (not shown) that extends from the top surface of chuck 16. After receiving the wafer 18, the lift is lowered to position the wafer 18 onto the top surface of chuck 16, and a vacuum is created between wafer 18 and chuck 16 to secure the wafer 18 to the chuck 16. The chuck 16 and wafer 18 are translated beneath stream 25 of cryogenic fluid via a motor (not shown) that is mechanically interconnected to chuck 16, and the stream 25 impinges upon the surface of wafer 18 to remove contaminants from the surface of the wafer. The vacuum between these components prevents relative motion between the wafer 18 and the chuck 16 as the chuck 16 is translated beneath stream 25 of cryogenic fluid. Again, the manner of supporting and moving a workpiece within the processing chamber 12 is not a particular aspect of the present invention. Any known or developed devices and/or controlling circuits and mechanisms can be utilized in accordance with the process chamber of the present invention. It is contemplated that other structures for supporting and moving the wafer 18 under stream 25 of cryogenic fluid can be used, such as a rotational chuck or a nozzle 20 that pivots back and forth to distribute stream 25 across wafer 18. In addition, other methods for securing wafer 18 to chuck 16, such as an electrostatic force maintained between these components or an edge grip provided to wafer 18, can be used.

In accordance with the present invention, a diffuser 32 is positioned upstream of the nozzle 20, and diffuser 32 is fluidly connected to a source of ultra-pure dry gas 34 through line 36. In the embodiment shown, diffuser 32 is positioned at a fixed location at the bottom of chamber 12 upstream of the nozzle 20 (described in more detail below). Diffuser 32 can be positioned in a number of locations within chamber 12 as may be desired for a particular application. In addition, diffuser 32 may be adjustably mounted within the chamber 12. Source 34 is pressurized and is provided to diffuser 32 through a control valve (not shown) in line 36. A flow of gas 30 can be dispensed from diffuser 32 into chamber 12 during the processing of wafer 18 to carry contaminants removed from the surface of wafer 18 by the impingement of the stream 25 of cryogenic fluid downstream. As described in commonly assigned U.S. Pat. No. 5,810,942, the stream of gas can be controlled in a variety of ways to minimize the recirculation of the contaminants onto the surface of wafer 18.

The interior 14 of chamber 12 can be evacuated to a desired processing pressure with a vacuum pump 40 that is connected to the chamber 12 through a vacuum pump valve 42. Vacuum pump 40 is used to evacuate the chamber 12 to the desired chamber pressure as required by a specific application. A throttle valve 44 having a controllably changeable fluid flow mechanism within it is included in series between the chamber 12 and the vacuum pump valve 42 and the vacuum pump 40, and throttle valve 44 is used to maintain the chamber pressure at the desired level. In this regard, a chamber pressure gauge 46 is supported to monitor the pressure within the interior 14 of the processing chamber 12 and is operatively connected to the throttle valve 44 as indicated by through line 49 in FIG. 1. Chamber pressure gauge 46 provides feedback to the throttle valve 44 to adjust its fluid flow mechanism and to permit the chamber pressure to be maintained at the desired level in any known manner.

Apparatus 10 further includes a handling device, such as transfer robot 50 (an end portion of which is illustrated in FIG. 1), that is positioned in a handling environment 52 that is adjacent the processing chamber 12. One or more wafers (not shown) to be processed in apparatus 10 are positioned in handling environment 52, and robot 50 is used to insert and remove wafer 18 into the chamber 12 from the wafers positioned in handling environment 52. Such robots are well known, and any such known or development robot may be used in accordance with the present invention, including those have X-Y directional movements and those also having Z direction movement (again depending on the particular application). In the embodiment shown, handling environment 52 is contained within a handling chamber 54 that can be sealed from the environment that generally surrounds the apparatus 10. Sealing chamber 54 prevents the introduction of dust and other contaminants into the handling environment 52 that may be present in the environment surrounding apparatus 10, which helps to minimize contamination of the wafers to be processed in apparatus 10. It is to be understood, however, that handling chamber 54 can be open to the surrounding environment if desired, and robot 50 and the wafers to be processed can also be positioned adjacent the processing chamber 12 without being positioned within a separately contained handling chamber if desired. This is particularly true if apparatus 10 is positioned in an environment that is substantially free of contaminants, such as a clean room environment.

A chamber valve 28 provides access to the processing chamber 12 from the handling chamber 54. In a preferred embodiment, the handling environment 52 within the handling chamber 54 is maintained at about the same or at a slightly greater pressure than the pressure of the environment that surrounds apparatus 10. Of course, other pressure environments are contemplated consistent with the operation of the present invention set out below. For example, the handling environment 52 within the handling chamber 54 can be maintained at a greater or lower pressure than that of the surrounding environment if desired. In accordance with the principles of the present invention described below, however, the pressure of the handling environment 52 is to be higher than the pressure at which the processing chamber 12 is maintained as the wafer 18 is cleaned by nozzle 20. A controllable chamber equalization port 48 is interconnected between the processing chamber 12 and the handling environment 52 as illustrated in FIG. 1 by a line 63 to permit the equalization of the interior 14 of chamber 12 with the handling environment 52.

More specifically, after wafer 18 has been processed within processing chamber 12 (e.g. after wafer 18 has been cleaned by stream 25 of cryogenic fluid), robot 50 is used to remove wafer 18 from chamber 12 and insert a new wafer onto chuck 16. As mentioned above, the handling environment 52 is maintained at a pressure that is at least and preferably greater than the pressure of the processing chamber 12 as the wafer 18 is cleaned. According to the present invention, the transfer of gas from the handling environment 52 into processing chamber 12 caused by the pressure differential between these environments is substantially prevented during transfer of the wafer 18 from chamber 12 because the processing chamber 12 is vented to an increased pressure from its processing pressure, the increased pressure being about the same pressure or a slightly greater pressure as that of the handling environment 52 (i.e. the pressure within handling chamber 54) prior to the opening of chamber valve 28 and the removal of wafer 18. This will prevent the handling environment 52 from flowing into chamber 12 during transfer.

Figure 2:
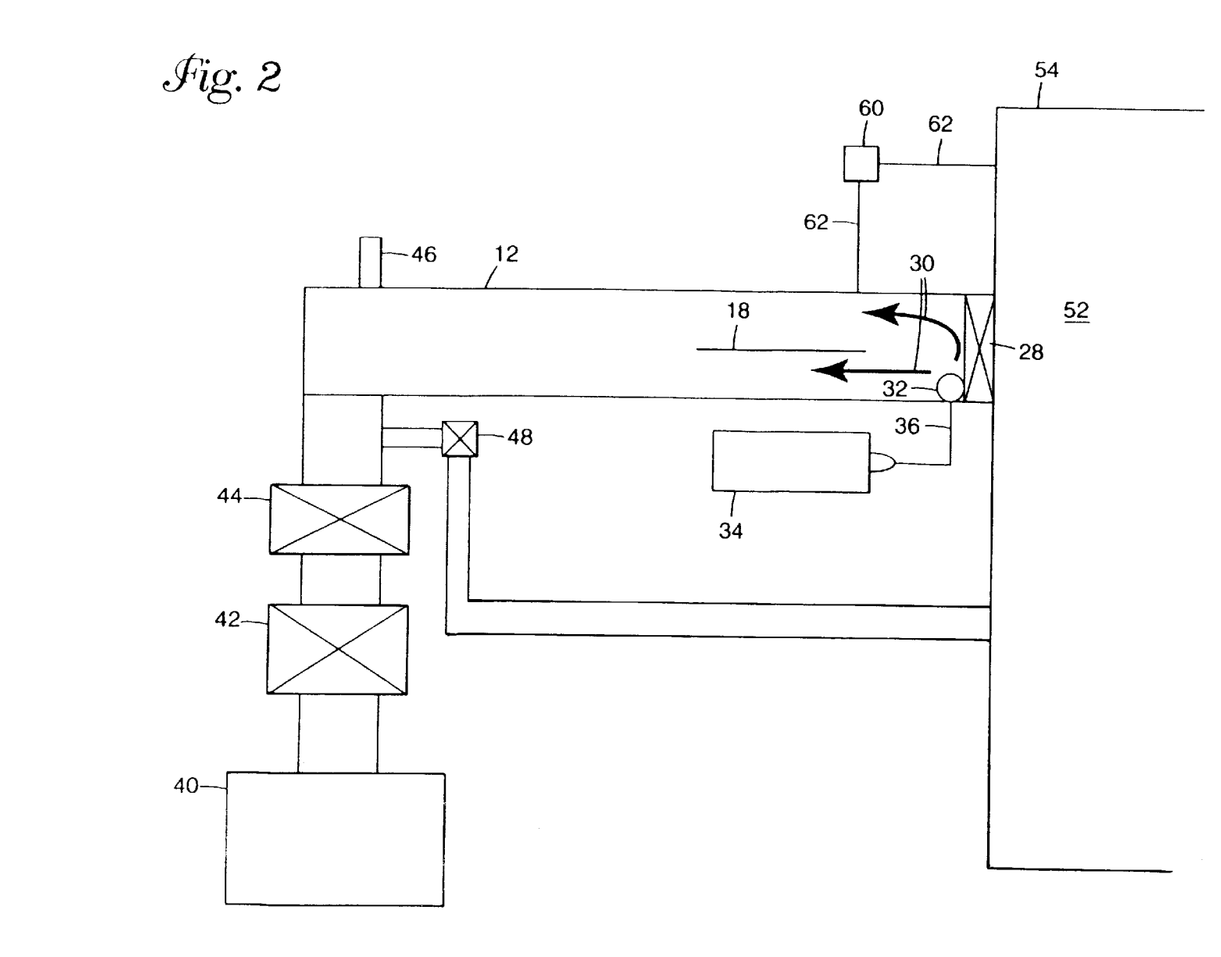
FIG. 2 is a schematic illustration of the step of venting a processing chamber to pressurize the chamber prior to transferring a wafer into or out of the processing chamber in accordance with the present invention.
Figure 3:
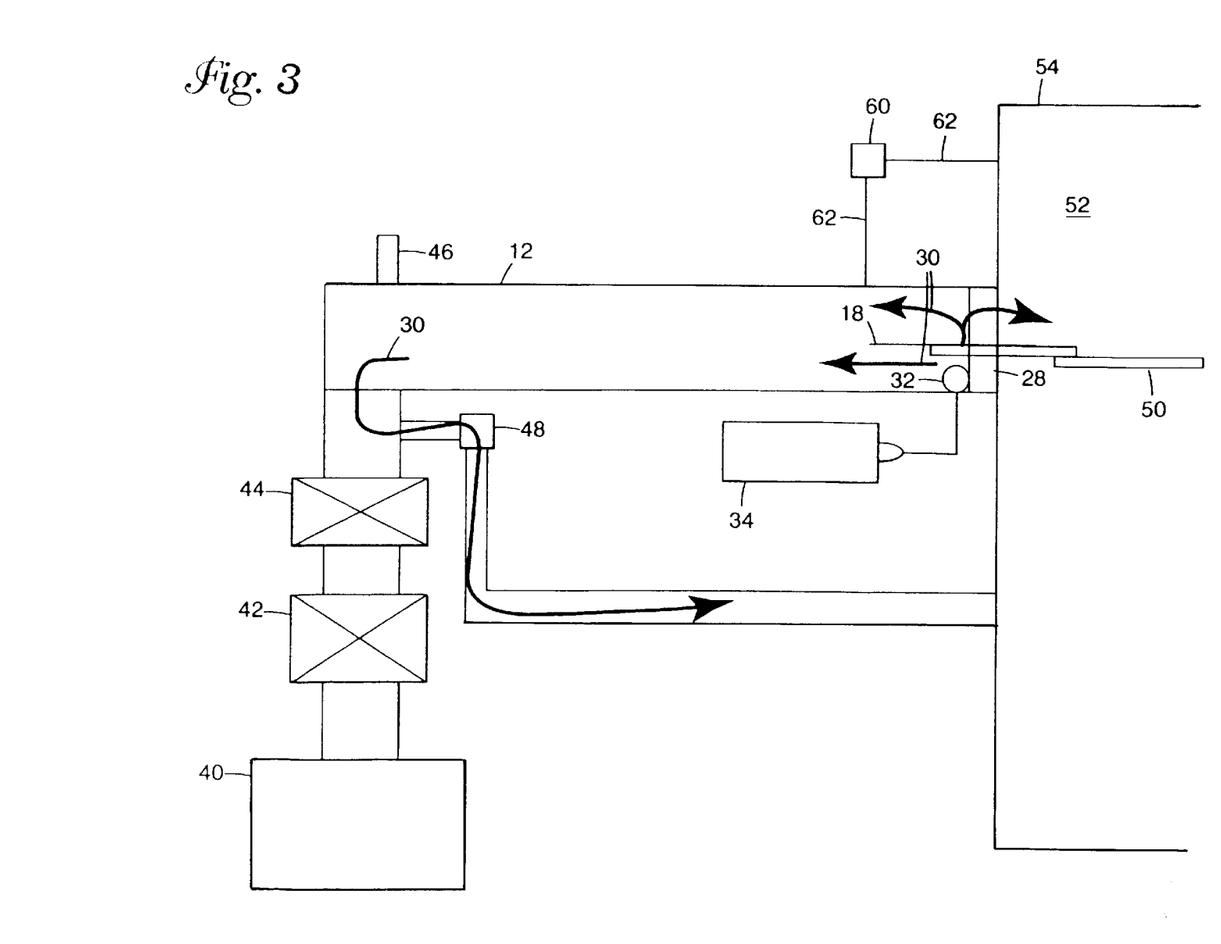
FIG. 3 is a schematic illustration of the step of transferring a wafer into or out of the processing chamber in accordance with the present invention.
Figure 4:
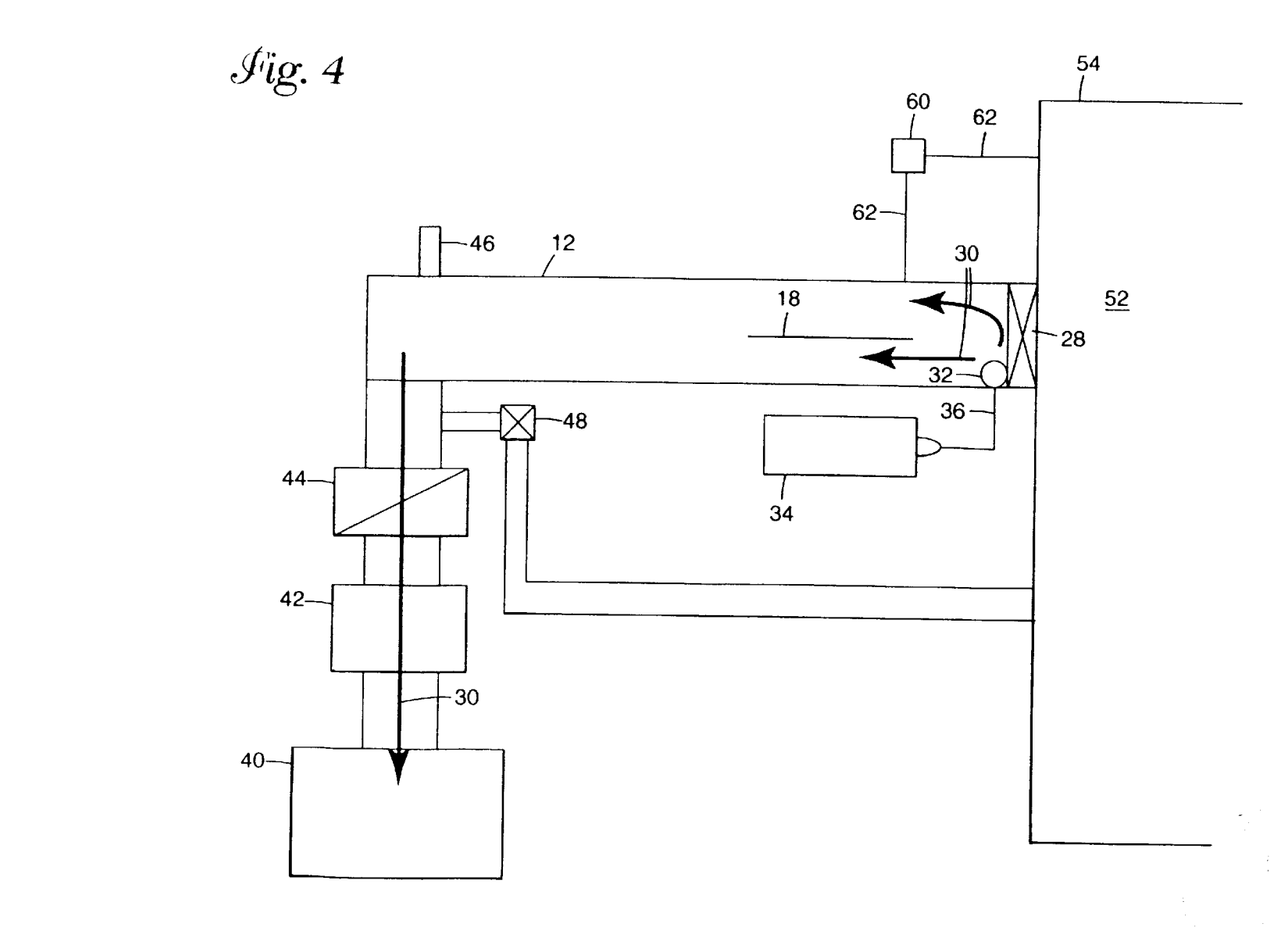
FIG. 4 is a schematic illustration of the step of pumping a processing chamber down to a desired vacuum pressure after a wafer has been transferred into the processing chamber and prior to processing the wafer in accordance with the present invention.

The venting and pressurization of chamber 12 is accomplished by the flow 30 of preferably an ultra-pure dry gas dispensed by diffuser 32 under the control of the application of valves 42, 44 and 28 and port 48. FIGS. 2–4 schematically illustrate, respectively, the steps of pressurizing the chamber 12, venting the chamber 12 and transferring the wafer 18 from chamber 12 and inserting a new wafer 18 into chamber 12, and pumping the chamber 12 down to the desired pressure in preparation for processing the new wafer inserted into the chamber 12. For simplicity, the nozzle 20 and the chuck 16 of apparatus 10 have not been illustrated in FIGS. 2–4 since these components of apparatus 10 are not operated during the steps being shown and described.

Referring now to FIGS. 2–3, upon completion of the cleaning of a wafer 18 with aerosol stream 25, the processing chamber 12 is pressurized and vented by closing the throttle valve 44 and thus eliminating the draw from the vacuum pump 40 through valve 42 and by opening the chamber equalization port 48 and the chamber valve 28 in a desired manner while maintaining a flow 30 of gas from the diffuser 32. As described below in connection with FIG. 5, it has been determined that flow 30 of gas can be dispensed from diffuser 32 at a reduced velocity as compared to the flow 30 of gas that is dispensed into chamber 12 during the processing of wafer 18. Flow 30 can of course be dispensed at other desired rates, both during the processing of wafer 18 and during the wafer transfer sequence described herein, depending on the process parameters of a specific application.

Preferably, the throttle valve 44 and the vacuum pump valve 42 are initially closed, thus effectively sealing processing chamber 12 upon completion of cleaning wafer 18. A flow 30 of gas from diffuser 32 is maintained (although, as mentioned above and described below, at a reduced flow rate as compared to the flow of gas during the cleaning of the wafer 18), and in this manner, the interior 14 of chamber 12 is pressurized by flow 30. A pressure differential gauge 60 that is operatively interconnected between the interior 14 of chamber 12 and the handling environment 52 is used to determine when the chamber pressure approaches the pressure level of the handling environment 52.

Once the pressure in chamber 12 is at or slightly above the pressure of the handling environment 52, the chamber 12 is vented by opening the chamber equalization port 48. The flow 30 of gas from diffuser 32 flows through the chamber 12, through the equalization port 48 and is expelled into the handling environment 52. In this manner, the pressure in chamber 12 can be maintained at or slightly above the pressure of the handling environment 52 into and from which wafer transfer will occur. The flow 30 of gas from diffuser 32 into and through equalization port 48 also helps to create a favorable flow through chamber 12 that prevents recirculation and recontamination of a wafer 18 that is positioned within or that is transferred into chamber 12.

At any time during the pressurization of chamber 12, the vacuum that is used to hold the wafer 18 to the chuck 16 can also be released in preparation for the venting of chamber 12 and the removal of wafer 18. Once the chamber equalization port 48 has been opened, the chamber valve 28 between the chamber 12 and handling environment 52 is opened. Then, in accordance with one embodiment, a lift (not shown) is actuated to raise the wafer 18 from chuck 16, and robot 50 is translated through valve 28 and into chamber 12 to retrieve wafer 18. Robot 50 then removes the wafer 18, grasps a new wafer from an adjacent supply or cassette of wafers positioned within environment 52, and inserts the new wafer into chamber 12 and onto the lift, which is later actuated (typically during pump down described below) to lower the new wafer onto chuck 16.

Referring now to FIG. 4, after the new wafer is inserted into chamber 12, chamber 12 is "pumped down" to the desired processing pressure through controlled actuation of the chamber valve 28, the pump valve 42, the chamber equalization port 48, and the throttle valve 44. The presently preferred sequence for the actuation of these valves includes first closing the chamber valve 28 to seal chamber 12. The vacuum pump valve 42 is next opened, and a bleed path through the throttle valve 44 is established. The chamber equalization port 48 is next closed, and the throttle valve 44 is then given a set point to begin the evacuation of the chamber 12 with vacuum pump 40 to a desired pressure level. This sequence of valve actuation provides a controlled pump down that is intended to prevent inadvertently sucking gas from the handling environment into the chamber 12, while still permitting a rapid pump down of the chamber 12. The new wafer positioned within the chamber 12 can then be cleaned or otherwise processed as intended by apparatus 10. Once the wafer has been processed, the steps described above and illustrated in FIGS. 2–4 can be repeated to remove the wafer from chamber 12 into handling environment 52 and insert another wafer into chamber 12 from handling environment 52. This cycle is repeated until all the desired wafers have been processed.

While apparatus 10 is shown with a diffuser 32 used to create a flow 30 of gas from source 34, it is to be understood that flow 30 of gas from source 34 can be introduced into chamber 12 with a variety of chamber ventilation ports. For example, a controllable valve positioned on any interior surface of chamber 12 and fluidly coupled to source 34 through line 36 can be used to pressurize chamber 12 with flow 30 of gas. In addition, nozzle 20 could be adapted to pressurize chamber 12 after wafer 18 has been processed by fluidly connecting nozzle 20 with source 34 with an appropriate valve structure to switch between the source of cryogenic fluid and the source of ultrapure gas as necessary.

It is advantageous and preferred to maintain an evenly distributed flow 30 of gas across a width of the chamber 12, both during processing to remove contaminants impinged by stream 25 of cryogenic fluid, and during the venting of chamber 12 and transferring of a wafer 18 out of chamber 12 (and the subsequent insertion of a new wafer into chamber 12). An "evenly distributed flow" of gas is intended to mean a flow of gas that has a substantially uniform horizontal velocity in the downstream direction within chamber 12 as measured across the width of chamber 12. It is to be understood, however, that the flow of gas within chamber 12 can and will likely have a vertical component of velocity in addition to the downstream horizontal velocity component. Thus, in a preferred embodiment, diffuser 32 is used to create such an evenly distributed flow 30 of gas, referred to as a "curtain flow" of gas. More preferably, diffuser 32 is a sintered nickel rod that is fluidly coupled to source 34 through line 36 and that extends entirely across the interior 14 of chamber 12 in a direction transverse to the direction that the stream 25 of cryogenic fluid is propelled and the direction the chuck 16 translates (i.e. across the entire width of chamber 12).

A sintered rod as the diffuser 32 is preferred because such a diffuser 32 is porous in nature along its full length and about its circumference to provide a plurality of gas supply openings along the length of the rod, and thus dispenses gas and creates a curtain flow 30 across the width of the chamber 12. Other elongate rods having a plurality of gas supply openings can also be used, such as a ceramic or a stainless steel rod that have openings along the length of the rod, or a ceramic rod that is porous in nature. The curtain flow 30 of gas provides efficient removal of contaminants during processing, and the curtain flow 30 of gas from diffuser 32 also uniformly pressurizes chamber 12 once wafer processing is completed and the vacuum pump valve 42 and throttle valve 44 have been closed. This in turn provides rapid pressurization and venting of the chamber 12 in preparation of breaching chamber 12 for removing the wafer 18.

In addition, by pressurizing chamber 12 to be at or slightly above the pressure of the handling environment, once the chamber 12 has been breached by opening chamber valve 28, the curtain flow 30 of gas will partially flow out through the chamber valve 28 from the processing chamber 12 and into the handling environment 52 during wafer transfer. The flow of gas from chamber 12 and into handling environment 52 during wafer transfer is acceptable, and is in fact desirable, in that it prevents the introduction of moisture or other contaminants that may be present in the handling environment 52 into chamber 12. Moreover, because the curtain flow 30 of gas is preferably created from source 34 of ultra-pure dry gas, the transfer of flow 30 of gas into environment 52 will not transfer contaminants into the environment 52. Preventing the introduction of contaminants into chamber 12 during wafer transfer in the manner described above permits the rapid pump down of chamber 12 once a new wafer has been inserted into chamber 12. An evenly distributed flow 30 of gas from diffuser 32 also helps to define a desirable flow dynamic within chamber 12 that prevents recirculation and potential recontamination of wafer 18 and other components of apparatus 10.

Figure 5:
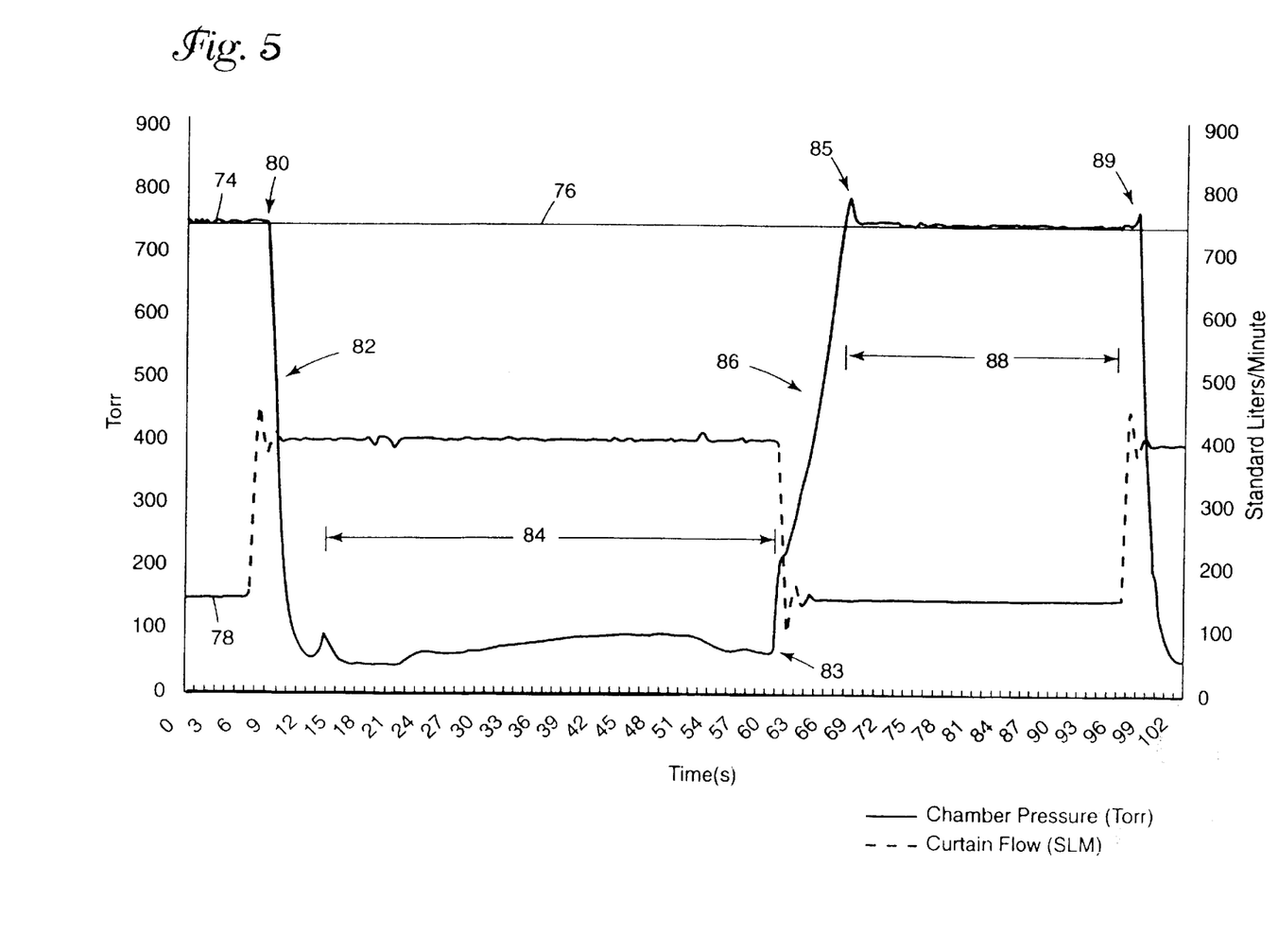
FIG. 5 is a graph showing the processing chamber pressure and the flow rate of a curtain flow of gas as a function of time in an apparatus in accordance with the present invention.

FIG. 5 is a graph representing one complete cycle of a cleaning operation through a cryogenic aerosol chamber comparing the pressure 74 within chamber 12 and the flow rate 78 of the curtain flow of gas 30 as a function of time. Line 76 represents the pressure of the handling environment 52. The pumping down of the chamber 12 from the pressure condition of the handling environment 52 to the chamber pressure under which wafer 18 is processed is shown generally at 82. The processing of wafer 18 is shown generally at 84. The venting and pressurization of chamber 12 to the pressure condition of handling environment 52 after processing and before wafer transfer is shown at 86. The transfer of wafer 18 from chamber 12 is shown at 88. Point 89 represents the initiation of another pump down of chamber 12 for the processing of the new wafer within the chamber 12.

In accordance with one specific example of a complete cycle, point 80 represents the start of the pump down portion 82 shown in FIG. 4 and described above. Point 80 represents the closing of the chamber valve 28 and chamber equalization port 48 coupled with the opening of the throttle valve 44 and vacuum pump valve 42. With the throttle valve 44 and the vacuum pump valve 42 open, vacuum pump 40 pumps down chamber 12 to a desired pressure (shown generally at 84). In the representative process of FIG. 5, the starting chamber pressure (i.e. the pressure of the handling environment 52) is about 1 atmosphere, or about 760 Torr, and the chamber 12 is pumped down to a pressure of about 50 Torr. At point 83, after the wafer is cleaned the pressurization of chamber 12 is begun by closing the throttle valve 44 and the vacuum pump valve 42. The chamber 12 is rapidly pressurized to a pressure that is at or slightly greater than that of the handling environment 52 shown at line 76 (e.g. at or slightly greater than about 760 Torr). Point 85 represents the opening of the chamber equalization port 48 to permit the chamber 12 to be vented and equalized at or slightly above the pressure of the handling environment 52. The chamber valve 28 is opened once the robot 50 has been moved into position to access chamber 12 and is otherwise prepared to enter chamber 12. As shown in FIG. 5, the pumping down of chamber 12 during portion 82 can be accomplished in about 5 seconds, and the venting and pressurization of chamber 12 during portion 86 of the cycle described herein can be accomplished in about 5 seconds.

FIG. 5 also shows a specific example of the flow rate 78 of the curtain flow 30 of gas dispensed by diffuser 32. During the processing portion 84 of the cycle, the flow 30 of gas is dispensed at about 400 standard liters per minute into chamber 12. This flow rate has been experimentally determined to be efficient in removing contaminants that are dislodged from wafer 18 by the cleaning stream 25 of cryogenic fluid and in preventing recirculation of the contaminants back onto the wafer 18. Other flow rates can also, of course be used. As shown at point 83 the flow 30 of gas from diffuser 32 can be reduced during the pressurization and venting of the chamber 12 to a rate of about 150 standard liters per minute. This is because, as described above, chamber 12 is effectively sealed during this portion of the cycle, and 150 standard liters per minute of gas has been found to be sufficient to rapidly pressurize chamber 12 from 50 Torr to about 760 Torr as desired by the illustrated application. Once the wafer transfer has been effected (shown at 88) and the throttle valve 44 and vacuum pump valve 42 are opened (shown, for example, at point 80), the flow rate of the gas is increased back to a desired level for processing (e.g. about 400 standard liters per minute).

In a specific, representative embodiment of the present invention, a machined aluminum process chamber 12 was used. A conventional atmospheric handler with a suitable vacuum end effector was used for transfer robot 50. A Mott High Purity p/n 1400-3/8-1/4-11/94-20CLS100 sintered nickel rod commercially available from Mott Corporation, High Purity Division, of Farmington, Conn., was used as diffuser 32, with the sintered nickel rod being fluidly connected to a source 34 of high purity nitrogen gas. In the representative embodiment, the nitrogen gas was greater than 99.998% pure. Any inert gas with sufficient purity can of course be used. An Edwards Model GV400/EH2600 vacuum pump commercially available from BOC Edwards Company of Wilmington, Mass., was used along with an MKS Instruments Model 180-0080P vacuum pump valve and an MKS Instruments Model 153E throttle valve, both of which are commercially available from MKS Instruments Company of Andover, Mass. A VAT Model 07512-UA24-AAUI device commercially available from VAT Incorporated of Woburn, Mass., was used for chamber valve 28. The chamber equalization port 48 that was used was an MKS Instruments Model 153-0025K valve, and the chamber pressure gauge 46 that was used was an MKS Instruments Model 850, both of which are also commercially available from the MKS Instruments Company. The chamber differential gauge 60 that was used was an MKS Model 223 differential pressure transducer, commercially available from the MKS Instruments Company. It is contemplated that other suitable components adapted for a desired size of apparatus 10 can also be used.

As described above and shown in FIG. 5, the pressurization and venting of chamber 12 and the subsequent pumping down of chamber 12 to the processing pressure can each be effected in about 5 seconds, for a total of 10 seconds of preparation time between transfer and processing. This is compared to a conventional aerosol cleaning apparatus described above in the Background section, which requires 20 or more seconds to effect the pumping down of a processing chamber from the processing pressure to the vacuum pressure of the handling chamber prior to wafer transfer. In other words, the present invention reduces the time it takes to prepare processing chamber 12 for wafer transfer and for processing by more than one half. This increases the through-put of wafers through apparatus 10, and improves the efficiency of the overall manufacturing process of semiconductor wafers. Moreover, the apparatus 10 is less complex and costly than conventional apparatus since the handling environment does not need to be maintained at a low pressure. This leads to more efficient construction and maintenance of apparatus 10.

Although the present invention has been described with reference to preferred embodiments, workers skilled in the art will recognize that changes may be made in form and detail without departing from the spirit and scope of the invention.

What is claimed is:

1. A method for transferring a first microelectronic device between a first processing chamber and a second chamber, comprising the steps of:

providing a first microelectronic device;

providing a first processing chamber at a first pressure;

providing a second chamber adjacent to said first processing chamber at a second pressure that is greater then the first pressure;

positioning said microelectronic device in one of said first processing chamber and said second chamber;

raising the pressure in the first processing chamber from the first pressure to a level that is at least equal to the second pressure of the second chamber by providing a flow of gas to said first processing chamber;

opening a chamber equalization port operatively interconnected between the first processing chamber and the second chamber to permit gas flow between the first processing chamber and the second chamber;

opening a chamber valve interconnected between the first processing chamber and the second chamber for providing access to an interior of the first processing chamber from the second chamber and also permitting gas flow between the first processing chamber and the second chamber; and transferring the first microelectronic device from its position within one of the first processing chamber and the second chamber to a position within the other of the first processing chamber and the second chamber through the chamber valve after the chamber equalization port and the chamber valve have been opened.

2. The method of claim 1, further comprising a step of providing a source of ultrapure gas in communication with said first processing chamber and raising the pressure in the first processing chamber by diffusing said flow of gas from said ultrapure gas source into the first processing chamber.

3. The method of claim 2, wherein the step of diffusing said flow of gas into the first processing chamber includes diffusing a flow of nitrogen gas into the first processing chamber.

4. The method of claim 2, wherein the step of diffusing said flow of gas includes dispensing the gas through an elongate rod having gas supply openings substantially throughout its extension, the rod being coupled to the source of ultrapure gas, the gas supply openings creating an evenly distributed flow of gas as the gas flows into and through the rod.

5. The method of claim 2, wherein the first processing chamber is an aerosol processing chamber that includes a nozzle fluidly connected to a source of cryogenic fluid, the nozzle for dispensing a stream of the cryogenic fluid toward a surface of a microelectronic device, when a microelectronic device is positioned within the first processing chamber.

6. The method of claim 2, wherein the step of transferring the first microelectronic device from its position within one of the first processing chamber and the second chamber to a position within the other of the first processing chamber and the second chamber includes engaging the first microelectronic device with a robotic arm positioned in the second chamber, the robotic arm accessing the first processing chamber through the chamber valve interconnected between the first processing chamber and the second chamber.

7. The method of claim 4, wherein the gas is dispensed from a sintered nickel rod.

8. The method of claim 5, wherein the step of transferring the first microelectronic device from its position within one of the first processing chamber and the second chamber to a position within the other of the first processing chamber and the second chamber comprises transferring the first microelectronic device from the second chamber through the chamber valve and into the first processing chamber.

9. The method of claim 5, wherein the step of transferring the first microelectronic device from its position within one of the first processing chamber and the second chamber to a position within the other of the first processing chamber and the second chamber comprises transferring the first microelectronic device from the first processing chamber through the chamber valve and into the second chamber.

10. The method of claim 9, further including the step of positioning a second microelectronic device into the first processing chamber after the first microelectronic device has been transferred through the chamber valve from the first processing chamber to the second chamber.

11. The method of claim 10, further including the steps of:

sealing the first processing chamber after the second microelectronic device is positioned within the first processing chamber;

reducing the pressure within the first processing chamber to the first pressure in preparation for processing the second microelectronic device; and processing the second microelectronic device by dispensing a stream of cryogenic fluid through the nozzle mounted within the first processing chamber, the stream of cryogenic fluid being dispensed toward the second microelectronic device to impinge upon a surface of the second microelectronic device to remove contaminants that may be contained on the surface of the second microelectronic device.

12. The method of claim 11, further including the step of diffusing said flow of gas through the first processing chamber concurrently with the processing of the second microelectronic device.

13. The method of claim 12, wherein the step of diffusing said flow of gas concurrently with the processing of the second microelectronic device includes dispensing the gas through an elongate rod having gas supply openings substantially throughout its extension that is fluidly coupled to the source of ultrapure gas, the gas supply openings creating an evenly distributed flow of gas as the gas flows into and through the rod.

14. A method for processing a first microelectronic device by a cryogenic cleaning apparatus having a first processing chamber and a second chamber, the method comprising the steps of:

providing a first microelectronic device;

providing a first processing chamber at a first pressure, the first processing chamber having a chuck for supporting a microelectronic device within the first processing chamber, a nozzle for dispensing a stream of cryogenic aerosol, and a chamber valve to permit a microelectronic device to be transferred into and out of the first processing chamber;

providing a second chamber at a second pressure that is greater than the first pressure, the second chamber being adjacent to said first processing chamber and openable to the first processing chamber by way of the chamber valve;

supporting said first microelectronic device within the first processing chamber and reducing the pressure within the first processing chamber to a processing pressure;

directing cryogenic aerosol against a surface of the first microelectronic device while the first processing chamber is held at the processing pressure;

raising the pressure in the first processing chamber from the processing pressure to a transfer pressure that is at least equal to a pressure of the second chamber by providing a flow of gas to said first processing chamber;

opening the chamber valve while the first processing chamber is at the transfer pressure and thereby providing access to an interior of the first processing chamber from the second chamber and also permitting gas flow between the first processing chamber and the second chamber; and transferring the first microelectronic device from the first processing chamber to the second chamber through the chamber valve after the chamber valve has been opened.

15. The method of claim 14, further including the step of opening a chamber equalization port that is operatively interconnected between the first processing chamber and the second chamber prior to opening the chamber valve and thus permitting gas flow between the first processing chamber and the second chamber in addition to the gas flow through the chamber valve.

16. The method of claim 14, wherein the step of reducing the pressure within the first processing chamber to the processing pressure includes:

closing the chamber valve;

actuating a valve to permit gas flow between a vacuum pump and the first processing chamber;

closing a chamber equalization port that permits gas flow between the first processing chamber and the second chamber; and actuating the vacuum pump to evacuate gas from within the first processing chamber and thereby reducing the pressure within the first processing chamber to the processing pressure.

17. The method of claim 14, wherein the step of raising the pressure in the first processing chamber from the processing pressure to the transfer pressure includes diffusing said flow of gas into the first processing chamber by a gas diffusion element that is interconnected with a source of gas.

18. The method of claim 14, wherein the step of transferring the first microelectronic device from the first processing chamber to the second chamber includes engaging the first microelectronic device with a robotic arm positioned in the second chamber, the robotic arm accessing the first processing chamber through the chamber valve.

19. The method of claim 14, further including the step of positioning a second microelectronic device within the first processing chamber and supporting the second microelectronic device on the chuck within the first processing chamber after the first microelectronic device has been transferred from the first processing chamber, and then reducing the pressure within the first processing chamber to the processing pressure.

20. The method of claim 17, wherein the gas diffusion element comprises an elongate rod having gas supply openings substantially throughout its extension, the elongate rod positioned within the first processing chamber, said flow of gas being an evenly distributed flow of gas dispensed through the gas supply openings of the elongate rod.

21. The method of claim 17, wherein the source of gas is an ultrapure gas source so that ultrapure gas is diffused as said flow of gas.

22. The method of claim 19, further including the steps:

directing cryogenic aerosol against a surface of the second microelectronic device while the first processing chamber is held at the processing pressure;

raising the pressure in the first processing chamber from the processing pressure to the transfer pressure by providing another flow of gas to said first processing chamber;

opening the chamber valve while the first processing chamber is at the transfer pressure and thereby providing access to the interior of the first processing chamber from the second chamber and also permitting gas flow between the first processing chamber and the second chamber; and transferring the second microelectronic device from the first processing chamber to the second chamber through the chamber valve after the chamber valve has been opened.

* * * * *

UNITED STATES PATENT AND TRADEMARK OFFICE
CERTIFICATE OF CORRECTION

PATENT NO. : 6,251,195 B1
DATED : June 26, 2001
INVENTOR(S) : Wagener et al.

It is certified that error appears in the above-identified patent and that said Letters Patent is hereby corrected as shown below:

Column 12,
Line 23, "then the first pressure;" should be -- than the first pressure; --

Signed and Sealed this

Fourth Day of June, 2002

Attest:

JAMES E. ROGAN
Attesting Officer          Director of the United States Patent and Trademark Office